United States Patent
Osvaldella

(10) Patent No.: US 7,230,498 B2
(45) Date of Patent: Jun. 12, 2007

(54) DELAY LINE FOR A RING OSCILLATOR CIRCUIT

(75) Inventor: Mauro Osvaldella, La Spezia (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 70 days.

(21) Appl. No.: 11/112,746

(22) Filed: Apr. 22, 2005

(65) Prior Publication Data

US 2005/0248414 A1 Nov. 10, 2005

(30) Foreign Application Priority Data

May 6, 2004 (IT) .......................... MI2004A0919

(51) Int. Cl.
*H03B 27/00* (2006.01)
(52) U.S. Cl. .................. 331/57; 327/158; 327/161; 327/277; 327/284; 327/159
(58) Field of Classification Search .................. 331/57; 327/158, 161, 277, 284, 159
See application file for complete search history.

(56) References Cited

U.S. PATENT DOCUMENTS

| | | | | | |
|---|---|---|---|---|---|
| 4,458,165 A | * | 7/1984 | Jackson | ...................... | 327/276 |
| 5,389,843 A | * | 2/1995 | McKinney | .................. | 327/276 |
| 5,465,076 A | * | 11/1995 | Yamauchi et al. | .......... | 331/179 |
| 5,467,041 A | * | 11/1995 | Baba et al. | .................. | 327/276 |
| 5,815,016 A | * | 9/1998 | Erickson | ..................... | 327/158 |
| 5,920,216 A | * | 7/1999 | Fischer | ....................... | 327/158 |

* cited by examiner

*Primary Examiner*—Robert Pascal
*Assistant Examiner*—Levi Gannon
(74) *Attorney, Agent, or Firm*—Hogan & Hartson LLP

(57) ABSTRACT

A delay line for a ring oscillator circuit includes at least one delay stage having a multiple logic gate delay cells driven by a multiplexer. The multiplexer is symmetrically configured and includes multiple logic gates that are similar to the logic gates of the delay stage.

14 Claims, 2 Drawing Sheets

DELAY LINE FOR A RING OSCILLATOR CIRCUIT

RELATED APPLICATION

The present application claims priority of Italian Patent Application No. MI2004A 000919 filed May 6, 2004, which is incorporated herein its entirety by this reference.

BACKGROUND OF THE INVENTION

1. Field of the Invention

The present invention relates to a delay line for a ring oscillator circuit. The invention relates particularly but not exclusively to a predetermined-value delay line for a ring oscillator circuit suitable to be used in phase locking systems and the following description is made with reference to this field of application for convenience of illustration only.

2. State of the Art

As it is well known, oscillator circuits are usually realized by rings of delay stages, comprising in turn elementary delay cells, connected and driven by convenient multiplexers.

A possible application of these ring oscillator circuits is in phase locking systems used in low-voltage power supplies. In particular, these phase locking systems require stable oscillators which can be varied in frequency by a control signal. It is also possible to use ring oscillator circuits in FM demodulators, clock generators for microcontrollers and for serial transmissions.

FIG. 1 shows a ring oscillator circuit realized according to the prior art, globally and schematically indicated with 1. The ring oscillator circuit 1 comprises a plurality of cascade-connected delay stages 3, controlled by a plurality of multiplexers 2 and fed back in a ring 4 by means of a logic gate 5 and a feedback delay stage 6.

For convenience of illustration, FIG. 1 shows a ring oscillator circuit 1 comprising three elementary delay stages 3, indicated with 3-1, 3-2 and 3-3, connected by means of three multiplexers 2, indicated with 2-1, 2-2 and 2-3. A first delay stage 3-1 has an input terminal directly connected to the feedback delay stage 6 and an output terminal connected to a first input terminal of a first multiplexer 2-1, having a second input terminal directly connected to the feedback delay stage 6 by means of a first fast line 7-1.

The first multiplexer 2-1 has also a control terminal receiving a first bit C0 of a control word and an output terminal connected to a second delay stage 3-2. Similarly to the first delay stage 3-1, this second delay stage 3-2 has an output terminal connected to a first input terminal of a second multiplexer 2-2.

The second multiplexer 2-2 has a second input terminal connected by means of a second fast line 7-2 to the output terminal of the first multiplexer 2-1, as well as a control terminal receiving a second bit C1 of the control word and an output terminal connected to a third delay stage 3-3. This third stage 3-3 has an output terminal connected to a first input terminal of a third multiplexer 2-3, having in turn a second input terminal connected by means of a third fast line 7-3 to the output terminal of the second multiplexer 2-2, as well as a control terminal receiving a third bit C2 of the control word.

The third multiplexer 3-3 has also an output terminal connected to a first input terminal of the logic gate 5, having in turn a second input terminal receiving an external reset signal RESET and an output terminal connected to the feedback delay stage 6.

A clock signal CK is generated on the output terminal of the third multiplexer 2-3, corresponding to an output terminal OUT of the ring oscillator circuit 1.

Moreover, the delay stages 3-1, 3-2 and 3-3 comprise an increasing number of elementary delay cells 8, realized by single logic gates (NAND, NOR etc.), or in a 'standard cell', not being dedicated to any particular application. The delay stages 3-1, 3-2 and 3-3 and the corresponding multiplexers 2-1, 2-2, 2-3 form a plurality of delay lines of the ring oscillator circuit 1. In the example shown in FIG. 1 these stages and multiplexers are three, but it is possible to provide them in any number.

The ring oscillator circuit 1 realized according to the prior art is programmable by changing the control word C0-C2 sent to multiplexers 2. Reference is made to a digitally-controlled oscillator (DCO, or "Digital Controlled Oscillator"), which can be integrated in a completely digital technology and used in applications which cannot use analog circuits, such as completely digital phase locking rings.

The frequency of the ring oscillator circuit 1 is varied by dividing by a programmable number a starting frequency value. In this case, a very high starting frequency value must be provided to obtain a good resolution. The design and realization of a digital divider for a value N is not simple for the frequency values which would be required. It is also possible to realize the ring oscillator circuit 1 by using tristate elements. In this case it is, however, difficult to obtain high frequency values together with wide frequency variation ranges.

It should be noted that a delay stage realizes a desired programming delay Tp only when it is driven by a delay stage preceding it in the ring 4, driven in turn by a previous delay stage. In fact, only in this case, the load conditions applied at the input of the delay stages are the same. Actually, as it is immediately evident, the ring 4 comprises a first and a last stage having different load conditions from the one of a delay stage in the ring and they have thus slightly different propagation delay values.

In its more general form, the delay Tc of the chain of N stages 3 of the ring 4 is given by:

$$Tc = Tp*N - k$$

with Tp the ideal propagation delay of a stage; and k the deviation from this ideal propagation delay due to the first and last stage of the chain.

It is thus evident that, in reckoning the oscillation period of the ring oscillator circuit 1, this deviation k having to be multiplied by the number of delay stages. A reckoned period is thus obtained, which can even be considerably different from the theoretical one. Moreover, this deviation k is variable, depending on the number of delay stages being selected to obtain a desired value for the oscillator circuit oscillation period.

This is a considerable limitation of the ring oscillator circuit 1 realized according to the prior art, because an uncertainty of the obtained signal period is unacceptable in many applications.

The technical problem underlying the present invention is to provide a ring oscillator circuit, having such structural and functional features as to overcome the limits still affecting the circuits realized according to the prior art.

SUMMARY OF THE INVENTION

According to an embodiment of the present invention, delay lines driven by a multiplexer with a symmetrical structure are provided to make uniform the load values of the delay stages comprised in the ring oscillator circuit chain. According to an embodiment of the present invention, a delay line for a ring oscillator circuit of the type comprising at least one delay stage comprising a plurality of elementary delay cells realized by logic gates and driven by a multiplexer, wherein the multiplexer is symmetrically configured and it comprises a plurality of logic gates being similar to said delay stage logic gates.

The features and advantages of the ring oscillator circuit delay line according to the invention will be apparent from the following description of an embodiment thereof given by way of non-limiting example with reference to the attached drawings.

DETAILED DESCRIPTION

Figure 1:
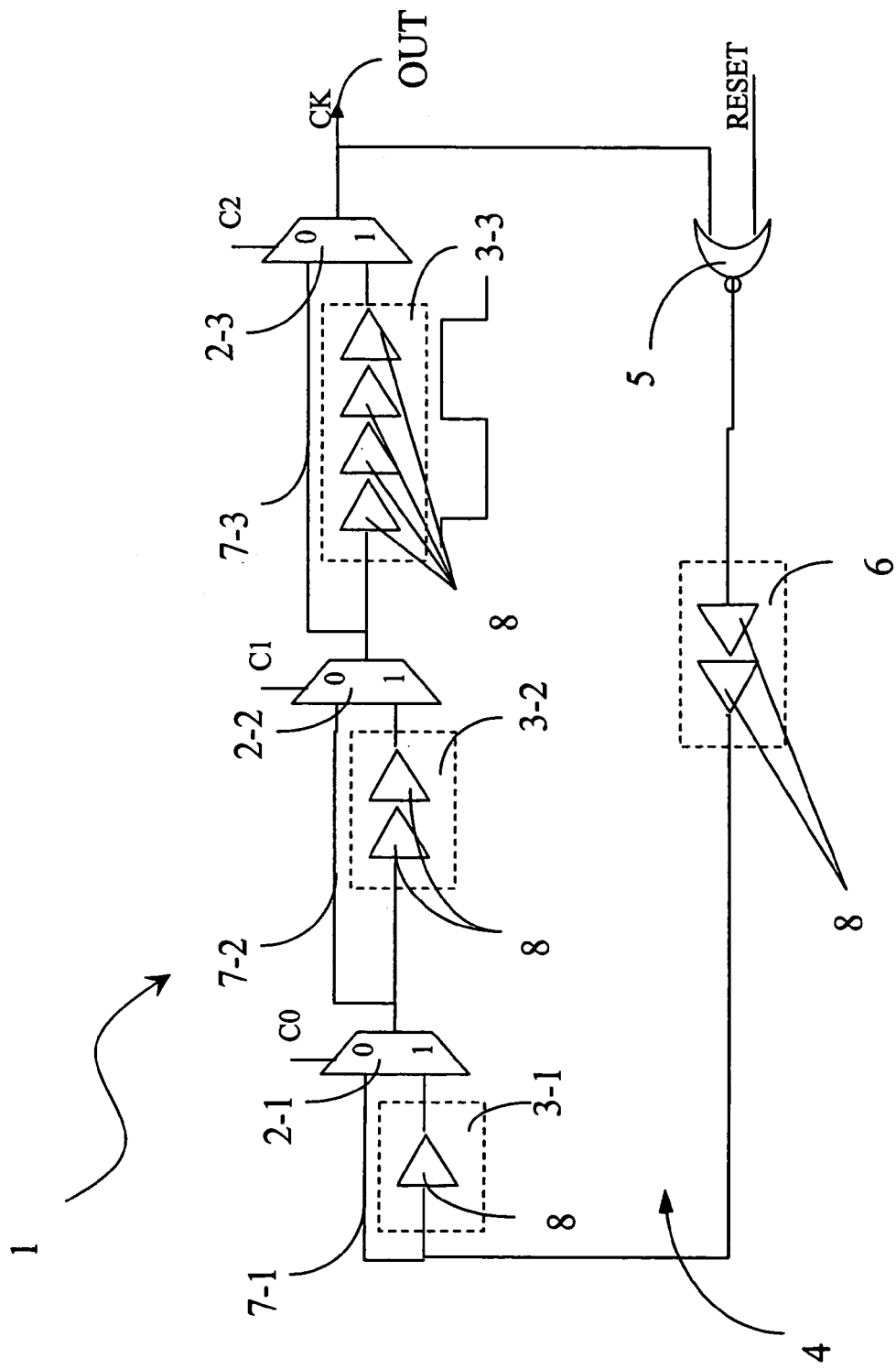
FIG. 1 shows a ring oscillator circuit realized according to the prior art.
Figure 2:
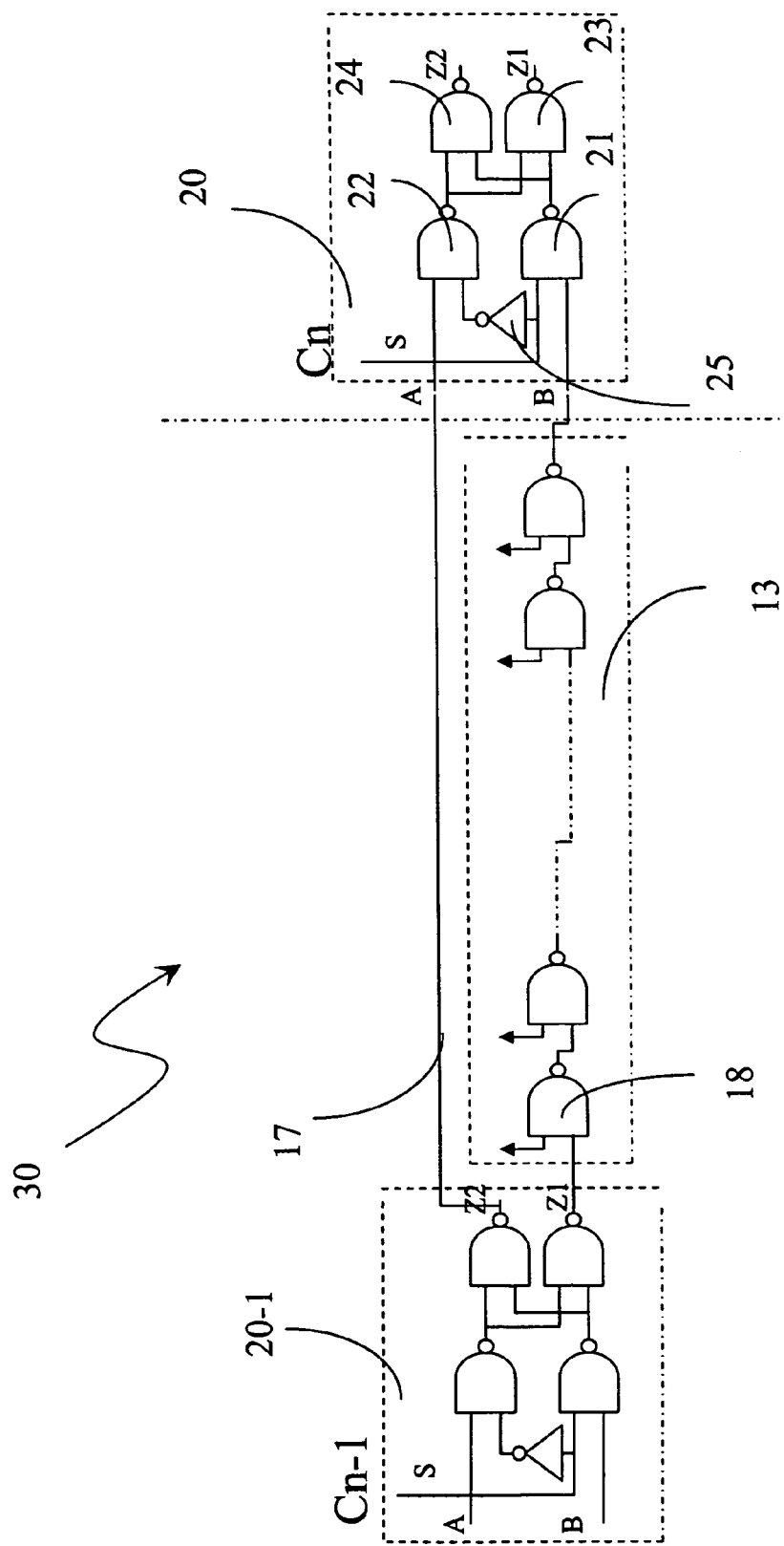
FIG. 2 shows a delay line for a ring oscillator circuit realized according to the invention.

With reference to the figures and particularly to FIG. 2, a delay line for a ring oscillator circuit 10 realized according to the invention is now described, globally and schematically indicated with 30.

As seen with reference to the prior art, a ring oscillator circuit is realized by means of a plurality of delay lines 30, being cascade—connected to each other in a delay chain.

The delay line 30 comprises a delay stage 13 formed by a plurality of elementary delay cells realized by means of logic gates 18 connected, in series to each other, between a first input terminal Z1 and a first output terminal B of the delay cell 13, having in turn a second input terminal Z2 and a second output terminal A directly connected to each other by means of a fast line 17.

The logic gates 18 have an output terminal connected to a first input terminal of a following logic gate in the series of logic gates of the delay stage 13, as well as a second input terminal connected to a voltage reference, particularly a supply voltage reference VDD in the case of logic gates of the NAND type like in the embodiment of FIG. 2, or a ground GND in the case of logic gated of the NOR type.

Advantageously according to an embodiment of the invention, delay line 30 comprises a symmetrical multiplexer 20 having a first input terminal connected to the first output terminal B of the delay stage 13 and a second input terminal connected to the second output terminal A of the delay stage 13.

In particular, the symmetrical multiplexer 20 comprises a first logic gate 21 having a first input terminal connected to the first output terminal B of the delay stage 13 and a second input terminal connected to a control terminal S of the symmetrical multiplexer 20.

As seen with reference to the prior art, the control terminal S is suitable to receive a control word bit.

The symmetrical multiplexer 20 also comprises a second logic gate 22 having a first input terminal connected, by means of an inverter 25, to the second input terminal of the first logic gate 21 and a second input terminal connected to the second output terminal A of the delay stage 13.

The first logic gate 21 has also an output terminal connected to a first input terminal of a third logic gate 23 comprised in the symmetrical multiplexer 20, as well as to a first input terminal of a forth logic gate 24, always comprised in the symmetrical multiplexer 20.

Similarly, the second logic gate 22 has also an output terminal connected to a second input terminal of the third logic gate 23, as well as to a second input terminal of the forth logic gate 24.

The third 23 and forth logic gate 24 have also respective output terminals connected to a first Z1 and second output terminal Z2 of the symmetrical multiplexer 20, corresponding to the input terminals of a following delay stage in the delay chain of the oscillator circuit according to the invention.

Advantageously according to an embodiment of the invention, the logic gates 21 to 24 comprised in the symmetrical multiplexer 20 are of the NAND type and they correspond to the logic gates 18 of the delay stage 13.

It can be immediately verified that the delay line 30 according to the invention has a delay exactly corresponding to Td*N, being Td the delay of a single delay cell 18 and N the number of cells of delay stage 13 comprised in delay line 30 and driven by symmetrical multiplexer 20.

Moreover, the structure being suggested for the symmetrical multiplexer 20 allows it to be used to input-drive all the delay lines 30 of a ring oscillator and it is itself an output load.

Thus, advantageously according to an embodiment of the invention, in the ring oscillator realized by means of a plurality of delay lines 30, a first stage of the delay chain is also driven as it were inside the chain and, similarly, the last delay chain stage sees a load corresponding to the one seen by the internal chain stages.

In fact, the NAND logic gates comprised in the symmetrical multiplexers driving the delay stages according to the invention are similar to the logic gates 18 of the chain delay stages.

Therefore, advantageously according to an embodiment of the invention, a monotonic and regular feature of the ring oscillator circuit (DCO) is obtained.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. A delay line for a ring oscillator circuit of the type including at least one delay stage comprising:
   a plurality of elementary delay cells comprising logic gates; and
   a symmetrical multiplexer for driving said plurality of elementary delay cells, said symmetrical multiplexer comprising:

a first logic gate having a first input terminal coupled to a first output terminal of said delay stage and a second input terminal coupled to a control terminal of said symmetrical multiplexer; and a second logic gate having a first input terminal coupled to the second input terminal of said first logic gate and a second input terminal coupled to a second output terminal of said delay stage.

2. The delay line according to claim 1, wherein said symmetrical multiplexer further comprises a third logic gate having a first input terminal coupled to an output terminal of said first logic gate and a second input terminal coupled to an output terminal of said second logic gate.

3. The delay line according to claim 2, wherein said symmetrical multiplexer further comprises a fourth logic gate having a first input terminal coupled to the output terminal of said first logic gate and a second input terminal coupled to the output terminal of said second logic gate.

4. The delay line according to claim 3, wherein said third and fourth logic gates have respective output terminals coupled to a first and second output terminal of said symmetrical multiplexer.

5. The delay line according to claim 3, wherein said logic gates of said symmetrical multiplexer comprise NAND gates.

6. The delay line according to claim 1, wherein said second input terminal of said first logic gate is coupled to said first input terminal of said second logic gate by an inverter.

7. The delay line according to claim 1, wherein a control terminal of said symmetrical multiplexer receives a control word bit.

8. A delay line for a ring oscillator comprising:
a plurality of coupled delay stages, each stage comprising:
a symmetrical multiplexer including:
first and second inputs;
first and second outputs;
a first logic gate having a first input terminal coupled to the first output terminal of a previous multiplexer and a second input terminal coupled to a control terminal of said multiplexer; and a second logic gate having a first input terminal coupled to the second input terminal of said first logic gate and a second input terminal coupled to the output terminal of said plurality of coupled delay stages; and a plurality of coupled delay cells having an input and an output, wherein for at least one of the delay stages, the first output of the symmetrical multiplexer is coupled to the first input of the symmetrical multiplexer in a next delay stage, the second output of the symmetrical multiplexer is coupled to the input of the plurality of coupled delay cells, and the output of the plurality of coupled delay cells is coupled to the second input of the symmetrical multiplexer in the next delay stage.

9. The delay line of claim 8 wherein the control terminal receives a control word bit.

10. The delay line according to claim 8, wherein said multiplexer further comprises a third logic gate having a first input terminal coupled to an output terminal of said first logic gate and a second input terminal coupled to an output terminal of said second logic gate.

11. The delay line according to claim 10, wherein said multiplexer further comprises a fourth logic gate having a first input terminal coupled to the output terminal of said first logic gate and a second input terminal coupled to the output terminal of said second logic gate.

12. The delay line according to claim 11, wherein said third and fourth logic gates have respective output terminals coupled to a first and second output terminal of said multiplexer.

13. The delay line according to claim 11, wherein said logic gates of said multiplexer comprise NAND gates.

14. The delay line according to claim 8, wherein said second input terminal of said first logic gate is coupled to said first input terminal of said second logic gate by an inverter.

* * * * *